US008323872B2

(12) United States Patent
Hatakeyama et al.

(10) Patent No.: US 8,323,872 B2
(45) Date of Patent: *Dec. 4, 2012

(54) RESIST PROTECTIVE COATING MATERIAL AND PATTERNING PROCESS

(75) Inventors: Jun Hatakeyama, Joetsu (JP); Takeru Watanabe, Joetsu (JP); Yuji Harada, Joetsu (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 800 days.

This patent is subject to a terminal disclaimer.

(21) Appl. No.: 11/451,498

(22) Filed: Jun. 13, 2006

(65) Prior Publication Data

US 2007/0003867 A1    Jan. 4, 2007

(30) Foreign Application Priority Data

Jun. 15, 2005    (JP) .................................. 2005-174615

(51) Int. Cl.
G03C 1/00    (2006.01)
G03C 5/00    (2006.01)
G03F 7/00    (2006.01)

(52) U.S. Cl. ................ 430/273.1; 430/270.1; 430/271.1; 526/245; 526/247

(58) Field of Classification Search ............... 430/270.1, 430/273.1, 271.1; 524/544, 556; 526/245, 526/247, 319; 560/205, 219
See application file for complete search history.

(56) References Cited

U.S. PATENT DOCUMENTS

| 5,541,037 | A | 7/1996 | Hatakeyama et al. | |
|---|---|---|---|---|
| 7,316,886 | B2 * | 1/2008 | Kanda | 430/270.1 |
| 2003/0078352 | A1 * | 4/2003 | Miyazawa et al. | 526/245 |
| 2005/0019696 | A1 * | 1/2005 | Allen et al. | 430/281.1 |
| 2005/0250898 | A1 * | 11/2005 | Maeda et al. | 524/544 |
| 2006/0029884 | A1 * | 2/2006 | Hatakeyama et al. | 430/270.1 |
| 2006/0036005 | A1 * | 2/2006 | Kanda et al. | 524/55 |
| 2006/0251991 | A1 * | 11/2006 | Araki et al. | 430/270.1 |
| 2007/0026341 | A1 * | 2/2007 | Hatakeyama et al. | 430/270.1 |
| 2007/0099114 | A1 * | 5/2007 | Watanabe et al. | 430/270.1 |
| 2007/0122736 | A1 * | 5/2007 | Hatakeyama et al. | 430/270.1 |
| 2007/0122741 | A1 * | 5/2007 | Hatakeyama et al. | 430/270.1 |
| 2007/0166639 | A1 | 7/2007 | Araki et al. | |
| 2007/0178407 | A1 * | 8/2007 | Hatakeyama et al. | 430/270.1 |
| 2007/0249858 | A1 * | 10/2007 | Kinsho et al. | 560/223 |
| 2007/0275326 | A1 * | 11/2007 | Hatakeyama et al. | 430/270.1 |
| 2008/0008961 | A1 * | 1/2008 | Nishi et al. | 430/270.1 |
| 2008/0085466 | A1 * | 4/2008 | Harada et al. | 430/270.1 |
| 2008/0090172 | A1 * | 4/2008 | Hatakeyama et al. | 430/270.1 |
| 2010/0124720 | A1 | 5/2010 | Ishiduka et al. | |

FOREIGN PATENT DOCUMENTS

| JP | 60-38821 A | 2/1985 |
|---|---|---|
| JP | 62-62520 A | 3/1987 |
| JP | 62-62521 A | 3/1987 |
| JP | 5-74700 A | 3/1993 |
| JP | 6-273926 A | 9/1994 |
| JP | 7-181685 A | 7/1995 |
| JP | 2803549 B2 | 9/1998 |
| JP | 2006-133716 A | 5/2006 |
| JP | 2007-24959 A | 2/2007 |
| JP | 2007-249154 A | 9/2007 |

OTHER PUBLICATIONS

Soichi Owa et al.; "Immersion Lithography; its potential performance and issues", Proceedings of SPIE, vol. 5040, pp. 724-733, 2003.
T. Hirayama "Resist and Cover Material Investigation for Immersion Lithography", 2$^{nd}$ Immersion Workshop, Jul. 11, 2003.
Robert D. Allen et al.; "Design of Protective Topcoats for Immersion Lithography" Journal of Photopolymer Science and Technology, vol. 18, No. 5, pp. 615-619, 2005.
B. J. Lin "Semiconductor Foundry, Lithography, and Partners", Proceedings of SPIE, Mar. 4-6, 2002, pp. xxix-xlii, vol. 4690.
Yamashita, T. et al., "Synthesis of Fluorinated Materials for 193 nm Lithography"; Digest of Papers Microprocesses and Nanotechnology 2005, Oct. 25-28, 2005, Conference, pp. 56-57.
Yamashita, T. et al.; "Synthesis of Fluorinated Materials for 193 nm Immersion Lithography and 157 nm Lithography"; Journal of Photopolymer Science and Technology, vol. 18, No. 5, Jun. 28, 2005, pp. 631-639.
Yamashita, T. et al.; "Novel fluorinated polymers for application in 193-nm lithography and 193-nm immersion lithography"; Proceedings of SPIE—The International Society for Optical Engineering, vol. 6153, Feb. 22, 2006, pp. 615325/1-615325/13.

* cited by examiner

*Primary Examiner* — Cynthia Kelly
*Assistant Examiner* — Connie P Johnson
(74) *Attorney, Agent, or Firm* — Westerman, Hattori, Daniels & Adrian, LLP

(57) ABSTRACT

A resist protective coating material is provided comprising a polymer having a partial structure of formula (1) wherein $R^0$ is H, F, alkyl or alkylene, and $R^1$ is fluorinated alkyl or alkylene. In a pattern-forming process, the material forms on a resist film a protective coating which is water-insoluble, dissolvable in alkaline developer and immiscible with the resist film, allowing for effective implementation of immersion lithography. During alkali development, development of the resist film and removal of the protective coating can be simultaneously achieved.

$$\left[ \begin{array}{c} F \\ | \\ -C - C - \\ | \\ R^0 \end{array} \begin{array}{c} CF_3 \\ | \\ -C-OH \\ | \\ R^1 \end{array} \right] \quad (1)$$

7 Claims, No Drawings

RESIST PROTECTIVE COATING MATERIAL AND PATTERNING PROCESS

CROSS-REFERENCE TO RELATED APPLICATION

This non-provisional application claims priority under 35 U.S.C. §119(a) on Patent Application No. 2005-174615 filed in Japan on Jun. 15, 2005, the entire contents of which are hereby incorporated by reference.

TECHNICAL FIELD

This invention generally relates to a micropatterning process for the fabrication of semiconductor devices, and particularly to an immersion lithography process involving directing ArF excimer laser radiation having a wavelength of 193 nm from a projection lens toward a wafer, with water intervening between the lens and the wafer. More particularly, it relates to a resist protective coating material used as a resist overlay for protecting photoresist and a process for forming a resist pattern using the same.

BACKGROUND ART

In the recent drive for higher integration and operating speeds in LSI devices, the pattern rule is made drastically finer. The photolithography which is currently on widespread use in the art is approaching the essential limit of resolution determined by the wavelength of a light source. As the light source used in the lithography for resist pattern formation, g-line (436 nm) or i-line (365 nm) from a mercury lamp was widely used. One means believed effective for further reducing the feature size is to reduce the wavelength of exposure light. For the mass production process of 64 M-bit dynamic random access memory (DRAM, processing feature size 0.25 µm or less), the exposure light source of i-line (365 nm) was replaced by a KrF excimer laser having a shorter wavelength of 248 nm. However, for the fabrication of DRAM with a degree of integration of 256 M and 1 G or more requiring a finer patterning technology (processing feature size 0.2 µm or less), a shorter wavelength light source is required. Over a decade, photolithography using ArF excimer laser light (193 nm) has been under active investigation. It was expected at the initial that the ArF lithography would be applied to the fabrication of 180-nm node devices. However, the KrF excimer lithography survived to the mass-scale fabrication of 130-nm node devices. So, the full application of ArF lithography started from the 90-nm node. The ArF lithography combined with a lens having an increased numerical aperture (NA) of 0.9 is considered to comply with 65-nm node devices. For the next 45-nm node devices which required an advancement to reduce the wavelength of exposure light, the $F_2$ lithography of 157 nm wavelength became a candidate. However, for the reasons that the projection lens uses a large amount of expensive $CaF_2$ single crystal, the scanner thus becomes expensive, hard pellicles are introduced due to the extremely low durability of soft pellicles, the optical system must be accordingly altered, and the etch resistance of resist is low; the postponement of $F_2$ lithography and the early introduction of ArF immersion lithography were advocated (see Proc. SPIE Vol. 4690 xxix).

In the ArF immersion lithography, the space between the projection lens and the wafer is filled with water. Since water has a refractive index of 1.44 at 193 nm, pattern formation is possible even using a lens with NA of 1.0 or greater. Theoretically, it is possible to increase the NA to 1.44. The resolution is improved by an increment of NA. A combination of a lens having NA of at least 1.2 with ultra-high resolution technology suggests a way to the 45-nm node (see Proc. SPIE Vol. 5040, p 724).

Several problems associated with the presence of water on resist were pointed out. For example, profile changes occur because the acid once generated from a photoacid generator and the amine compound added to the resist as a quencher can be dissolved in water. The pattern collapses due to swelling. It was then proposed to provide a protective coating between the resist and water (see the 2nd Immersion Workshop, Jul. 11, 2003, Resist and Cover Material Investigation for Immersion Lithography).

In the lithography history, the protective coating on the resist layer was studied as an antireflective coating. For example, the antireflective coating on resist (ARCOR) process is disclosed in JP-A 62-62520, JP-A 62-62521, and JP-A 60-38821. The ARCOR process involves forming a transparent antireflective coating on top of a resist film and stripping it after exposure. Despite its simplicity, the process can form a micropattern at a high degree of definition, precision and alignment. When the antireflective coating is made of perfluoroalkyl compounds (e.g., perfluoroalkyl polyethers or perfluoroalkyl amines) having a low refractive index, the light reflection at the resist/antireflective coating interface is minimized so that the dimensional precision is improved. In addition to these materials, the fluorinated materials proposed thus far include amorphous polymers such as perfluoro(2,2-dimethyl-1,3-dioxol)-tetrafluoroethylene copolymers and cyclic polymers of perfluoro(allyl vinyl ether) and perfluorobutenyl vinyl ether as disclosed in JP-A 5-74700.

Because of their low compatibility with organic substances, the foregoing perfluoroalkyl compounds must be diluted with fluorocarbon solvents such as Freon for controlling a coating thickness. As is well known in the art, the use of fluorocarbons now raises an issue from the standpoint of environmental protection. The perfluoroalkyl compounds are awkward to form uniform films, and are not regarded satisfactory as antireflective films. Additionally, the antireflective films must be stripped with fluorocarbon solvents prior to the development of photoresist. These factors lead to many practical disadvantages including a need to add an antireflective film-stripping unit to the existing system and the increased cost of fluorocarbon solvents If the antireflective film is to be stripped without adding an extra unit to the existing system, it is most desirable to carry out stripping in the development unit. The solutions used in the photoresist development unit are an alkaline aqueous solution as the developer and deionized water as the rinse. It would be desirable to have an antireflective coating material which can be readily stripped with such solutions. For this reason, there were proposed a number of water-soluble antireflective coating materials and patterning processes using the same. See, for example, JP-A 6-273926 and Japanese Patent No. 2,803,549.

The water-soluble protective coatings, however, cannot be used in the immersion lithography because they are dissolved away in water during light exposure. On the other hand, water-insoluble fluoro-polymers pose a need for special fluorocarbon strippers and an exclusive stripping cup for fluorocarbon solvents. It was thus desired to have a resist protective coating which is water insoluble, but can be readily stripped.

For the immersion lithography resist protective coating, an attempt was made to incorporate hexafluoroalcohol groups to take advantage of their alkali solubility and water repellency. See Journal of Photopolymer Science and Technology, Vol. 18, No. 5, p 615 (2005).

It would be desirable to have a resist protective coating which is more hydrophobic and alkali developable.

SUMMARY OF THE INVENTION

An object of the invention is to provide a resist protective coating material which is best suited for the immersion lithography in that it enables effective pattern formation by the immersion lithography, it can be removed simultaneously with a photoresist layer during development, and it has improved process compatibility; and a pattern forming process using the same.

The inventors have discovered that when a film of a polymer having a partial structure of the general formula (1), shown below, is formed on a resist film as a resist protective coating, this protective coating is insoluble in water, dissolvable in alkali aqueous solution and immiscible with the resist film, so that it can be simultaneously stripped altogether during development of the resist film in alkaline water. This protective coating is amenable to the immersion lithography over a wider range.

In one aspect, the invention provides a resist protective coating material comprising a polymer having a partial structure of the general formula (1):

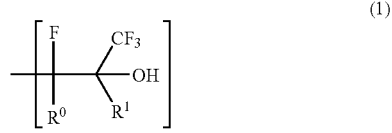

wherein $R^0$ is hydrogen, fluorine, or an alkyl or alkylene group of 1 to 8 carbon atoms, and $R^1$ is a straight or branched alkyl or alkylene group of 1 to 6 carbon atoms which contains at least one fluorine atom.

The invention also provides a resist protective coating material comprising a polymer bearing recurring units of the general formula (2).

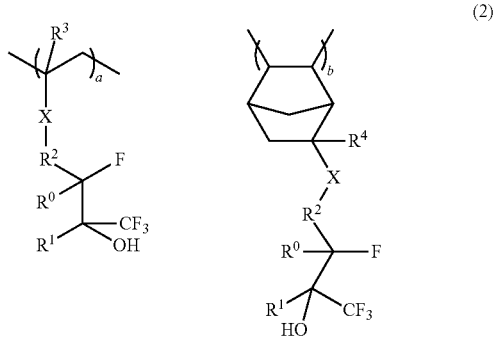

Herein $R^0$ is hydrogen, fluorine, or an alkyl or alkylene group of 1 to 8 carbon atoms; $R^1$ is a straight or branched alkyl or alkylene group of 1 to 6 carbon atoms which contains at least one fluorine atom; $R^2$ is a straight, branched or cyclic alkylene or alkylidyne group of 1 to 10 carbon atoms which may contain a fluorine atom; or $R^2$ may bond with $R^0$ or $R^1$ to form a ring with the carbon atoms to which they are bonded, wherein $R^0$ is an alkylene group of 1 to 8 carbon atoms or $R^1$ is a straight or branched alkylene group of 1 to 6 carbon atoms and $R^2$ is a straight or branched alkylidyne group of 1 to 10 carbon atoms; or $R^1$ and $R^2$ may bond together to form a ring with the carbon atoms to which they are bonded, wherein $R^1$ is a straight or branched alkylene group of 1 to 6 carbon atoms and $R^2$ is a straight or branched alkylidyne group of 1 to 10 carbon atoms; $R^3$ and $R^4$ are each independently hydrogen, fluorine, methyl or trifluoromethyl; X is —O—, —C(=O)—O— or —C(=O)—O—$R^5$—C(=O)=O—; $R^5$ is a straight, branched or cyclic alkylene group of 1 to 10 carbon atoms; the letter "a" is a number from 0 to 1, "b" is a number from 0 to 1, and the sum of a+b ranges from more than 0 to 1.

The polymer may further comprise recurring units of at least one type selected from among carboxyl-containing recurring units, fluoroalkyl-containing recurring units other than formula (2), and perfluoroalkyl-containing recurring units.

Typically, the resist protective coating material further comprises a solvent in which the polymer is dissolved.

In another aspect, the invention provides a lithography process for forming a pattern, comprising the steps of forming a photoresist layer on a wafer, forming a protective coating on the photoresist layer from a resist overlay material, exposing the layer structure to light, and developing, said resist overlay material being the resist protective coating material defined above.

The invention also provides an immersion lithography process for forming a pattern, comprising the steps of forming a photoresist layer on a wafer, forming a protective coating on the photoresist layer from a resist overlay material, exposing the layer structure in water to light, and developing, said resist overlay material being the resist protective coating material defined above. In this process, the exposing step preferably includes exposing the layer structure to light having a wavelength in the range of 180 to 250 nm through an projection lens while keeping water between the projection lens and the wafer. The developing step is preferably performed to develop the photoresist layer and strip the protective coating of resist overlay material at the same time, using a liquid alkaline developer.

BENEFITS OF THE INVENTION

In the pattern-forming process of the invention, since the protective coating formed on the resist film is dissolvable in alkali aqueous solution or alkaline developer and immiscible with the resist film, the immersion lithography can be conducted in a satisfactory manner. During alkali development, both development of the resist film and removal of the protective coating can be simultaneously achieved.

DESCRIPTION OF THE PREFERRED EMBODIMENTS

The invention addresses the immersion lithography process for forming a pattern by forming a photoresist layer on a wafer, forming a protective coating on the photoresist layer from a resist overlay material, exposing the layer structure in water to light, and developing. The resist protective coating material of the invention is best suited as the resist overlay material and characterized by comprising a polymer having a partial structure of the general formula (1):

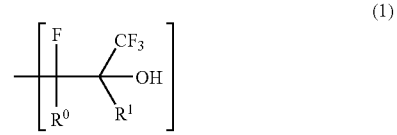

wherein $R^0$ is a hydrogen atom, a fluorine atom, or an alkyl or alkylene group of 1 to 8 carbon atoms, and $R^1$ is a straight or branched alkyl or alkylene group of 1 to 6 carbon atoms which contains at least one fluorine atom. It is understood that when $R^0$ or $R^1$ is alkylene, the structure of formula (1) becomes divalent. It is excluded that both $R^0$ and $R^1$ are alkylene at the same time.

The polymer having a partial structure of formula (1) includes recurring units which are preferably of the general formula (2).

(2)

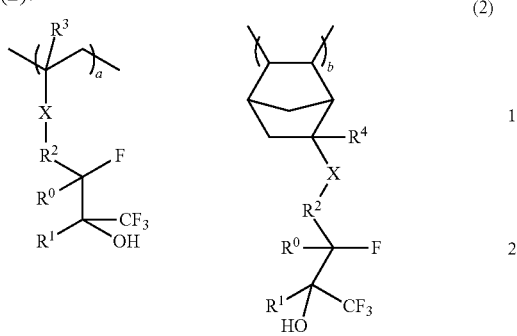

Herein $R^0$ is a hydrogen atom, a fluorine atom, or an alkyl or alkylene group of 1 to 8 carbon atoms; $R^1$ is a straight or branched alkyl or alkylene group of 1 to 6 carbon atoms which contains at least one fluorine atom; $R^2$ is a straight, branched or cyclic alkylene or alkylidyne group of 1 to 10 carbon atoms which may contain one or more fluorine atom. $R^2$ may bond with $R^0$ or $R^1$ to form a ring with the carbon atoms to which they are bonded, and in this event, $R^0$ is an alkylene group of 1 to 8 carbon atoms or $R^1$ is a straight or branched alkylene group of 1 to 6 carbon atoms and $R^2$ is a straight or branched alkylidyne group of 1 to 10 carbon atoms. $R^1$ and $R^2$ may bond together to form a ring with the carbon atoms to which they are bonded, and in this event, $R^1$ is a straight or branched alkylene group of 1 to 6 carbon atoms and $R^2$ is a straight or branched alkylidyne group of 1 to 10 carbon atoms. $R^3$ and $R^4$ are each independently hydrogen, fluorine, methyl or trifluoromethyl. X is —O—, —C(=O)—O— or —C(=O)—O—$R^5$—C(=O)—O— wherein $R^5$ is a straight, branched or cyclic alkylene group of 1 to 10 carbon atoms. The letters "a" and "b" are numbers in the range: $0 \leq a \leq 1$, $0 \leq b \leq 1$, and $0 < a+b \leq 1$.

The preferred polymer having a partial structure of formula (1) is a polymer comprising recurring units of formula (2). Using a polymer comprising recurring units of formula (2), a resist protective coating can be formed having a dissolution rate of up to 0.1 angstrom per second (Å/s) in water and a dissolution rate of at least 300 Å/s in a developer which is a 2.38 wt % aqueous solution of tetramethylammonium hydroxide (TMAH).

Illustrative, non-limiting examples of monomers capable of providing the recurring units (a) in formula (2) are given below.

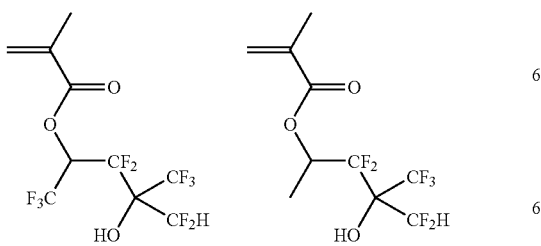

-continued

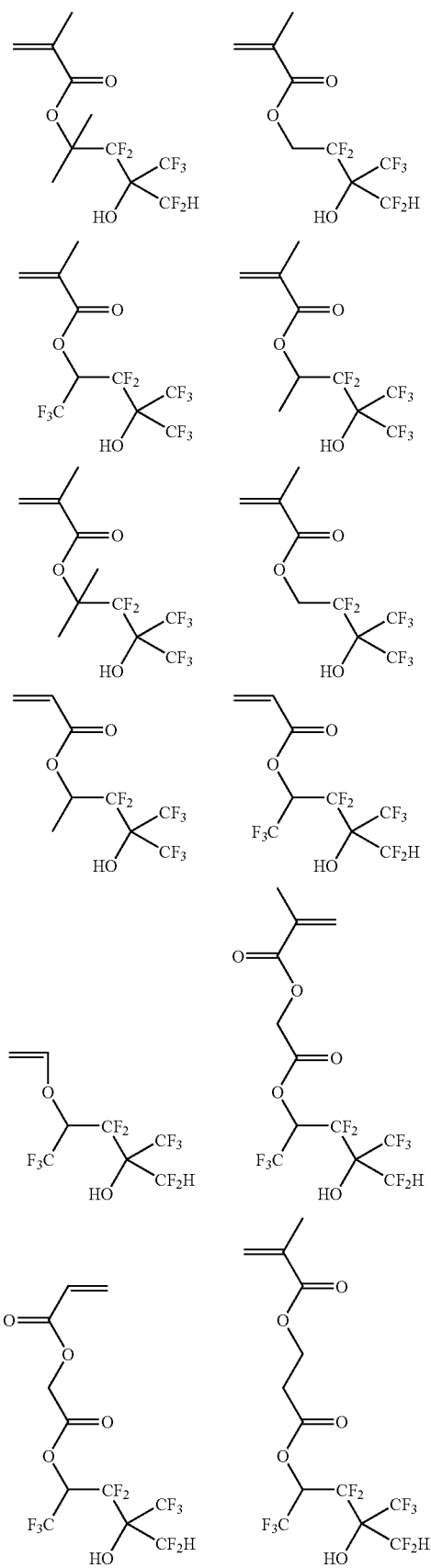

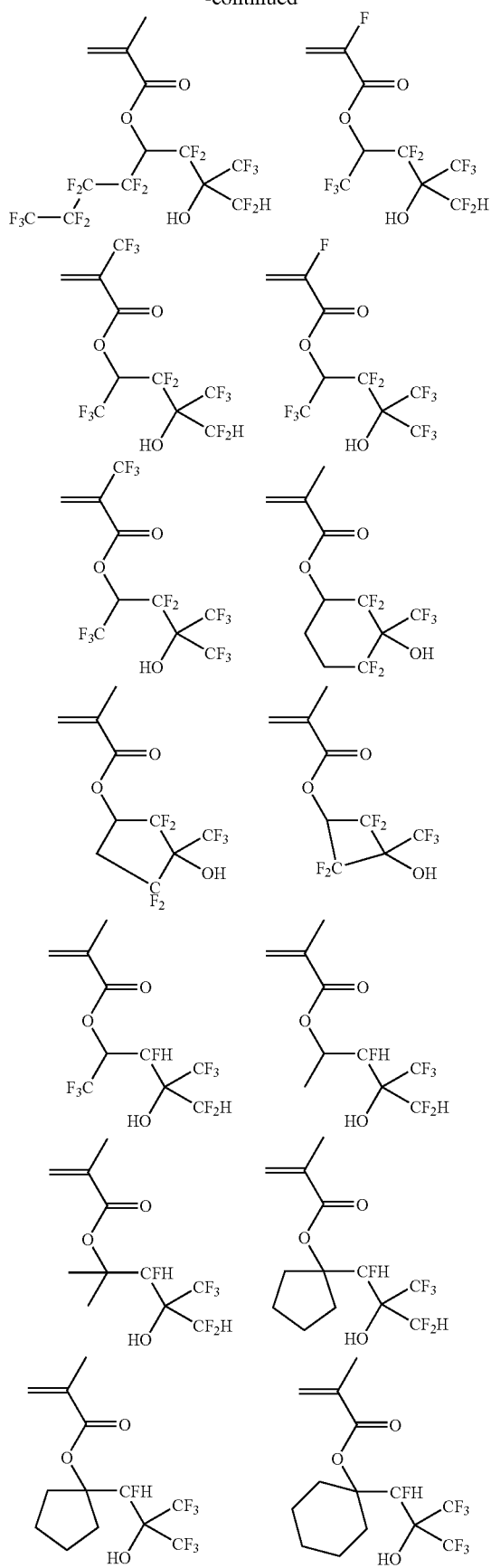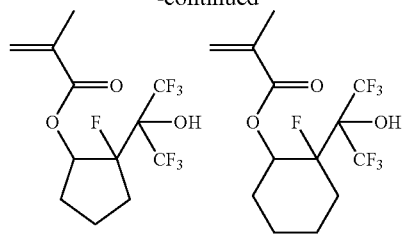
Illustrative, non-limiting examples of monomers capable of providing the recurring units (b) in formula (2) are given below.
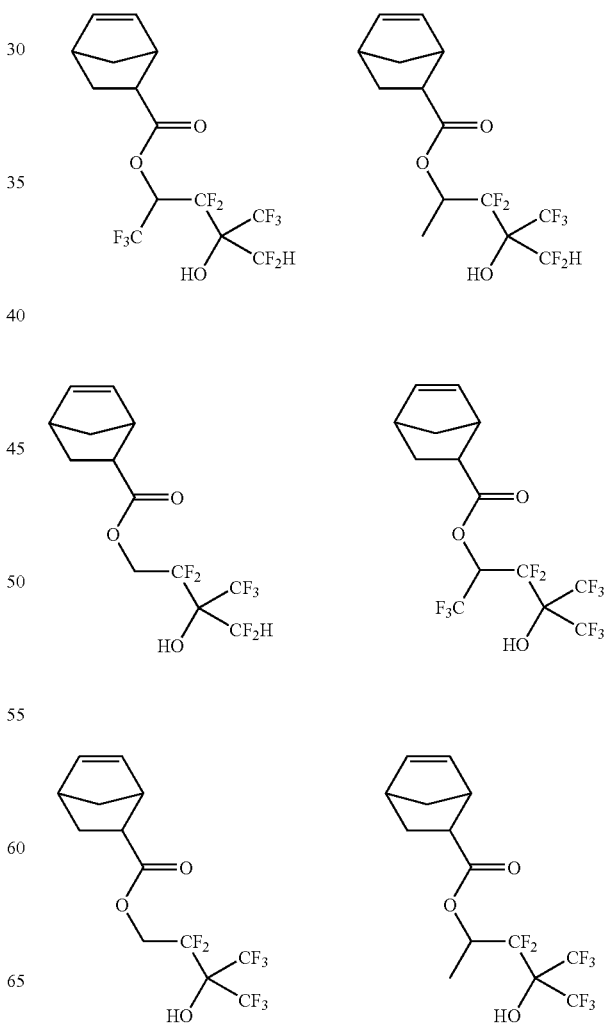

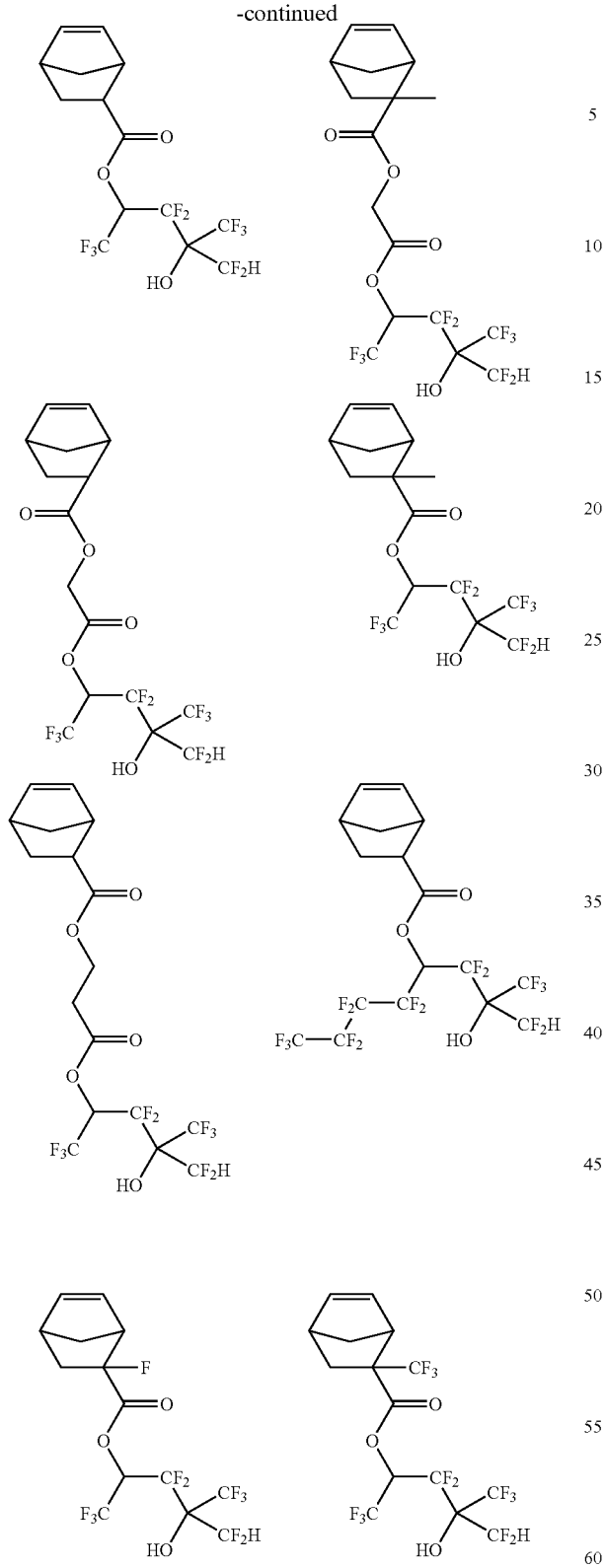
While the polymer for use in the resist protective coating of the invention should essentially include recurring units (a) and/or (b) represented by formula (2), it may have further copolymerized therein recurring units (c) having carboxyl groups for preventing intermixing with the resist film. Examples of the recurring units (c) are given below.
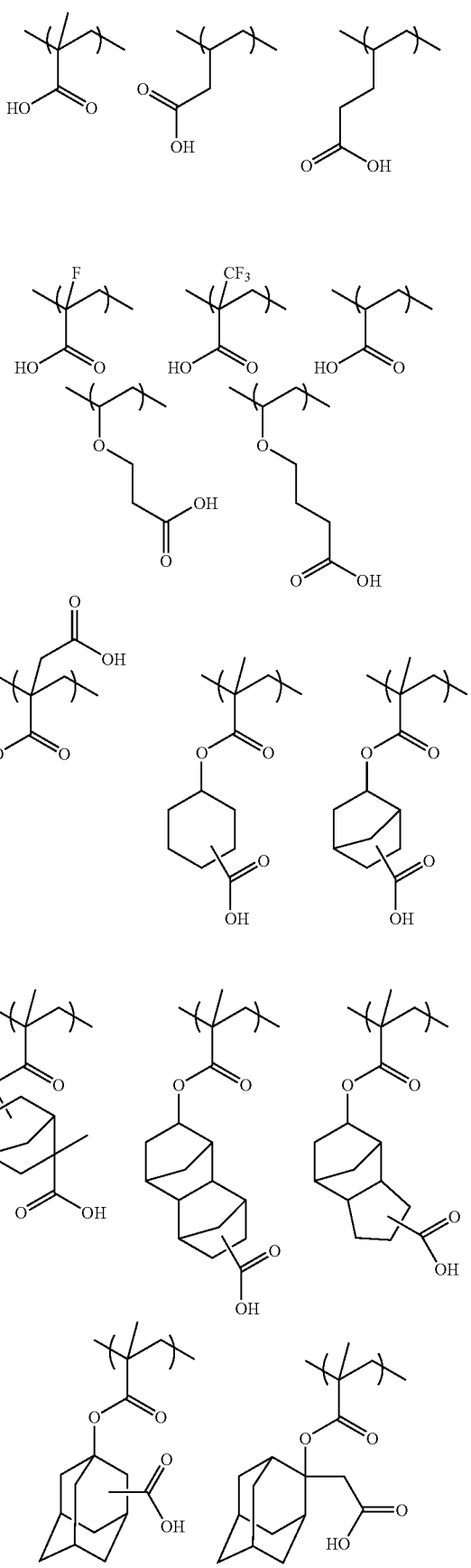

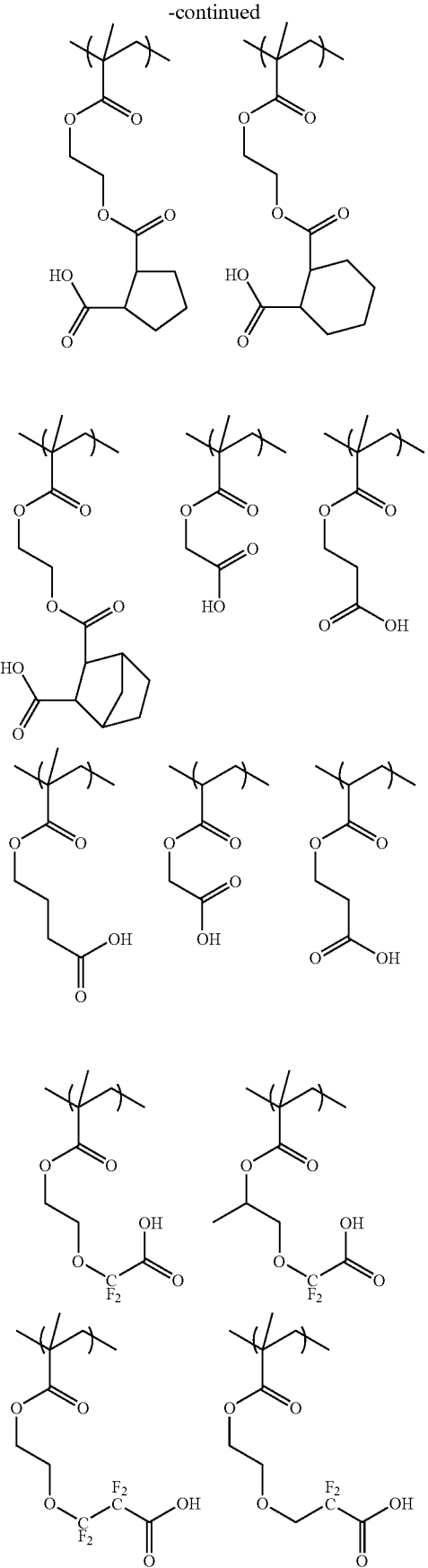
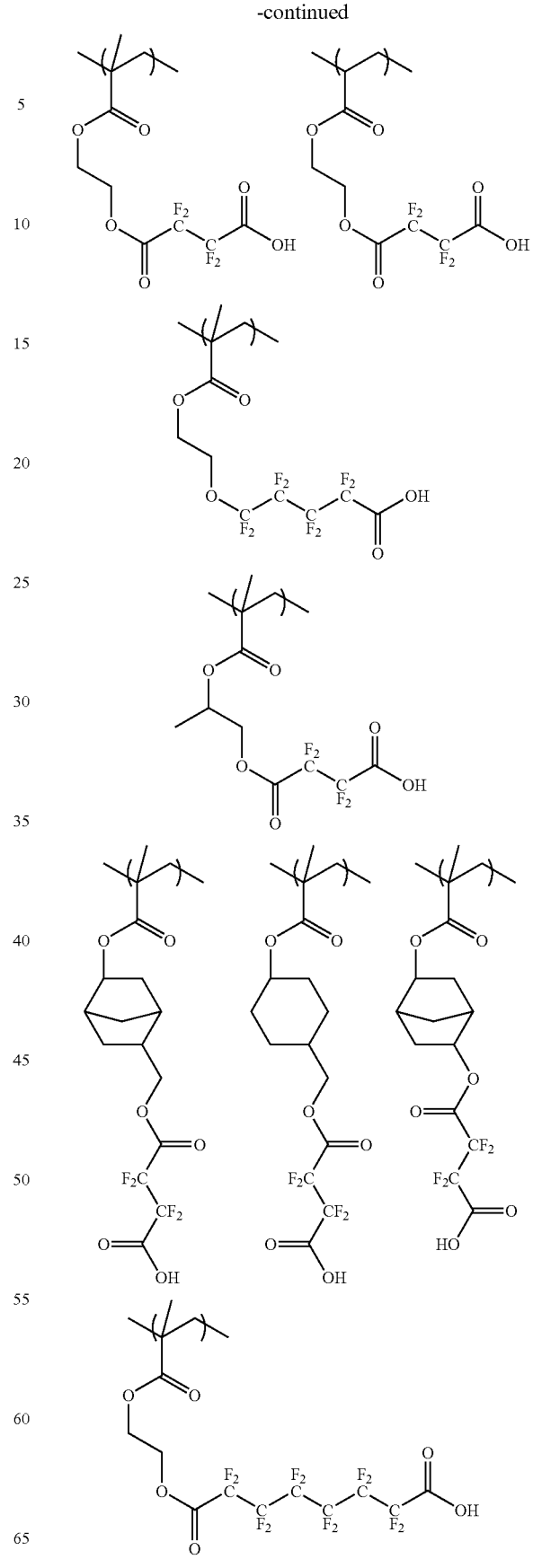

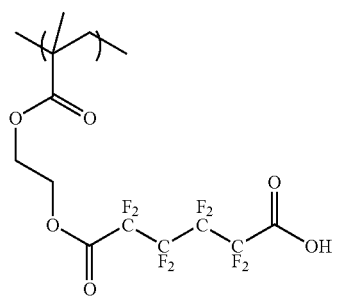 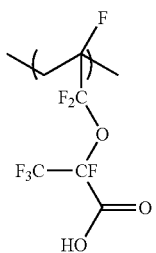 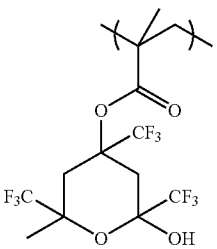 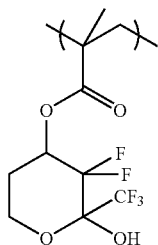
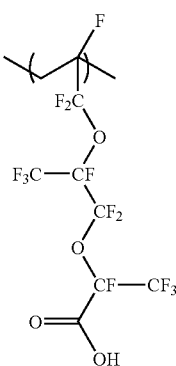 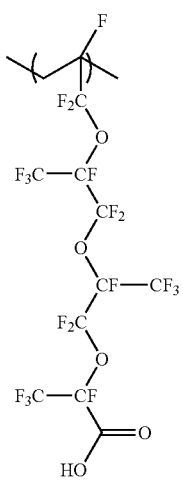 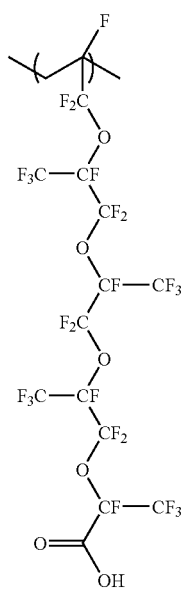 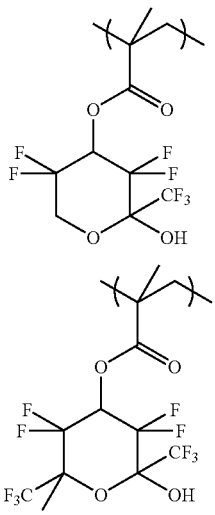 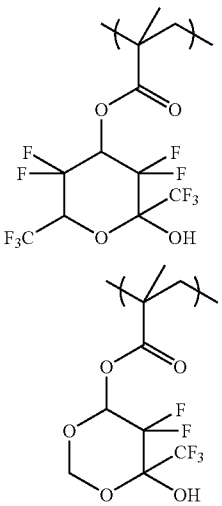
The polymer may have further copolymerized therein recurring units (d) having fluoroalcohol other than formula (2). Examples of the recurring units (d) are given below.
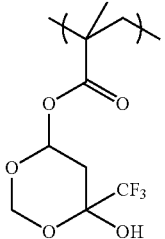 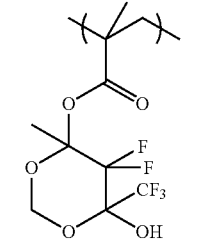
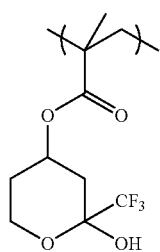 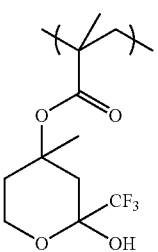 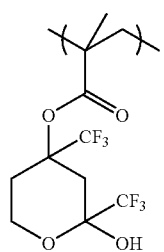
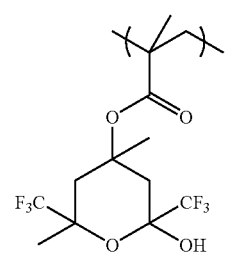 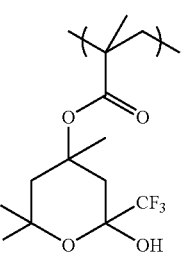 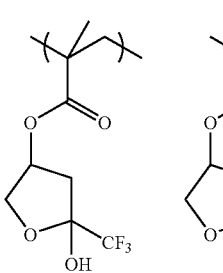 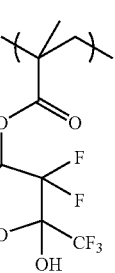 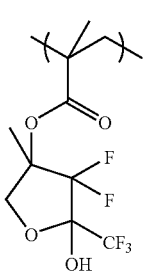

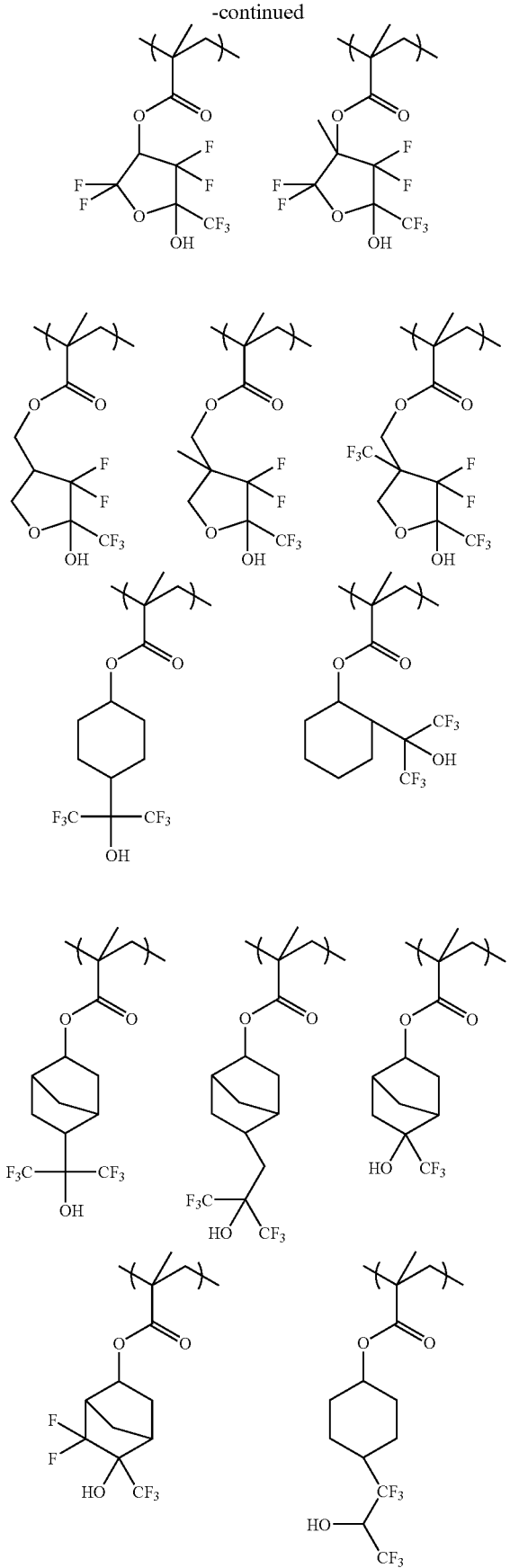
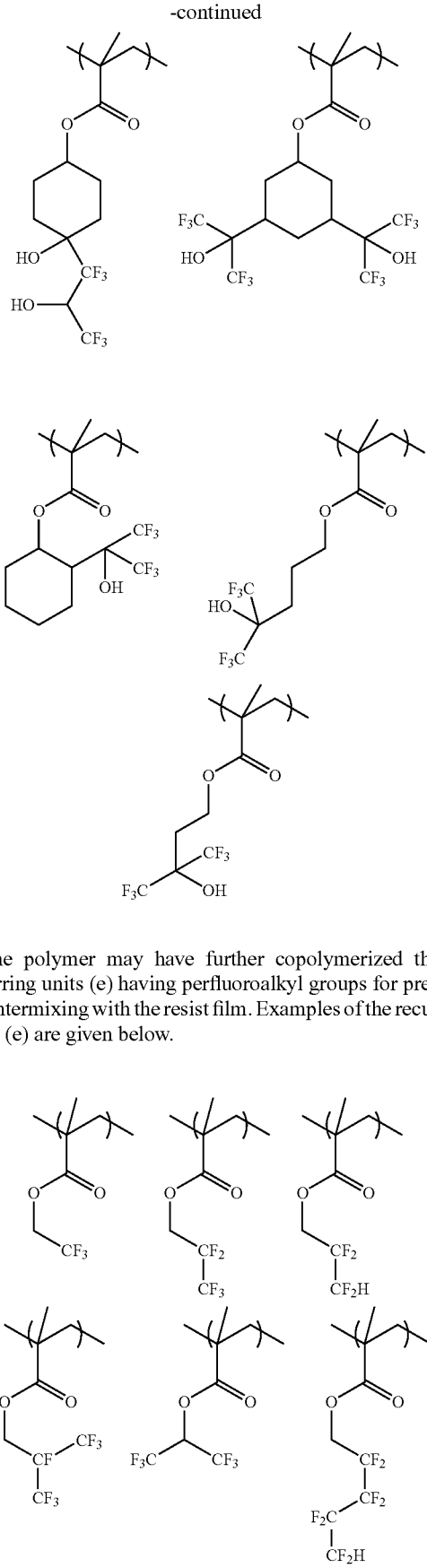
The polymer may have further copolymerized therein recurring units (e) having perfluoroalkyl groups for preventing intermixing with the resist film. Examples of the recurring units (e) are given below.
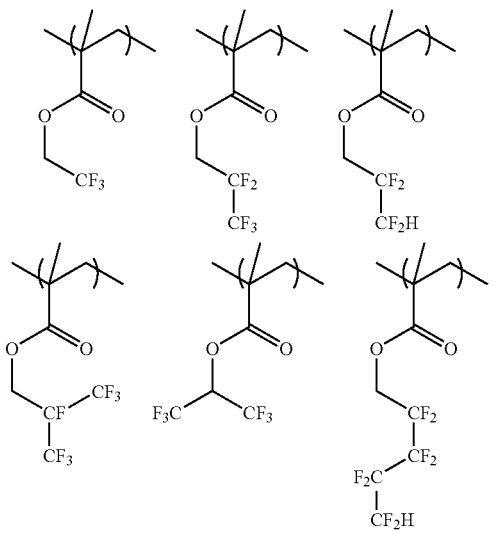

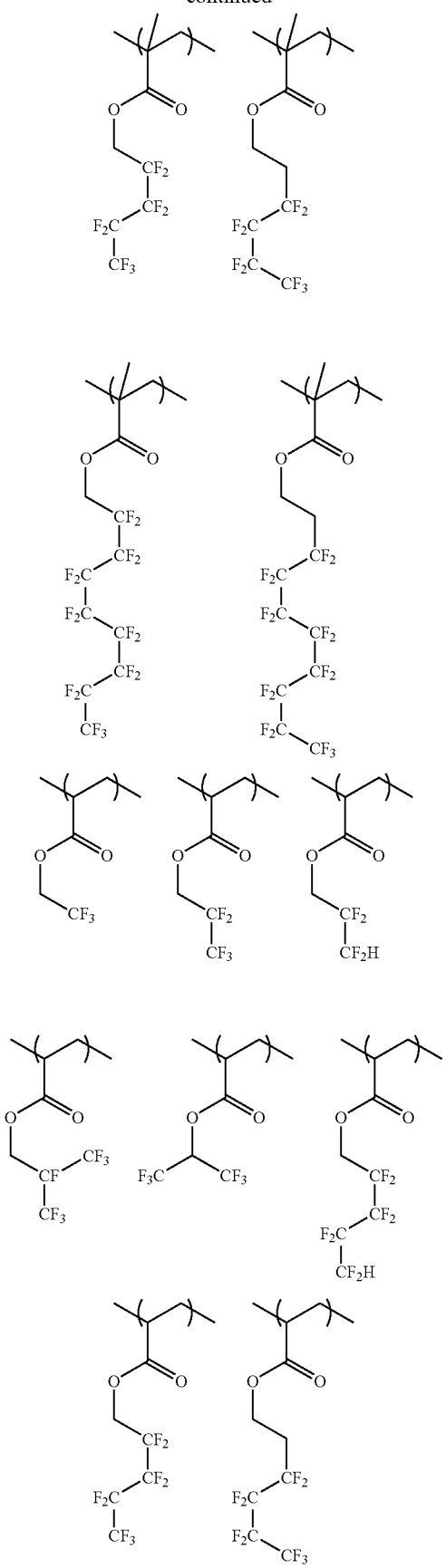
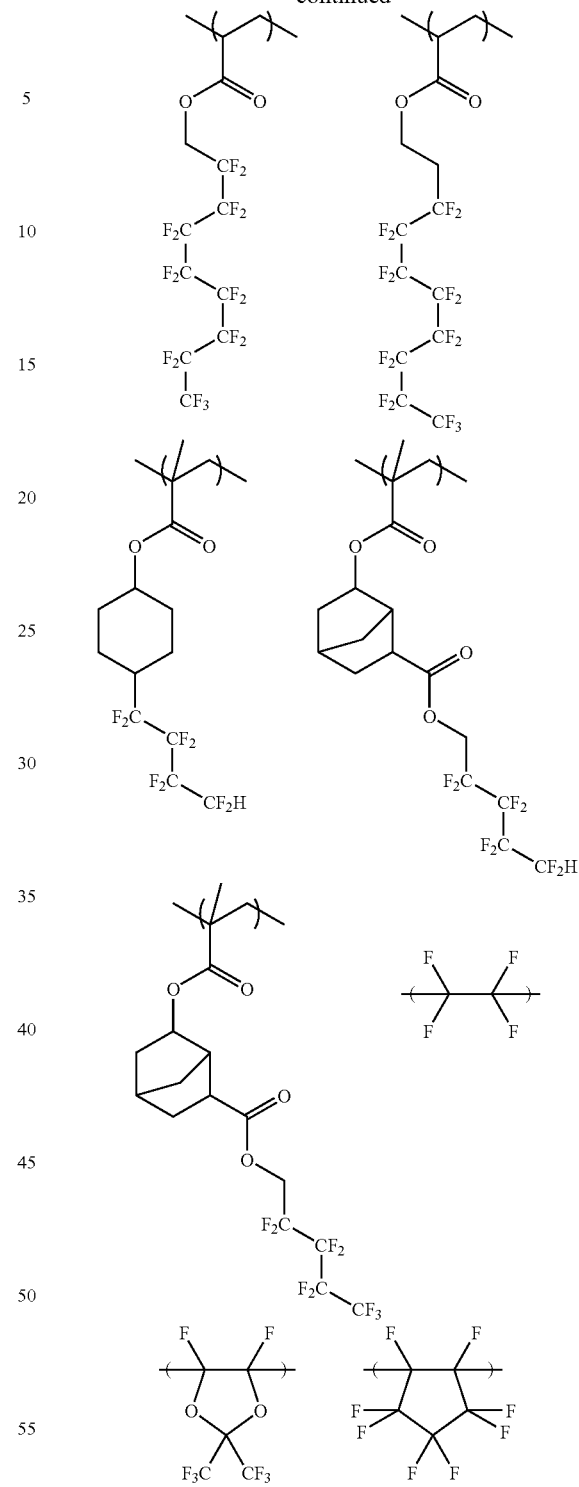

In the polymer, the recurring units (a), (b), (c), (d), and (e) are included in proportions in the range: $0 \leq a \leq 1.0$, $0 \leq b \leq 1.0$, $0 < a+b \leq 1.0$, $0 \leq c \leq 0.9$, $0 \leq d \leq 0.9$, and $0 \leq e \leq 0.9$; and preferably $0 \leq a \leq 0.8$, $0 \leq b \leq 0.8$, $0.1 \leq a+b \leq 0.8$, $0 \leq c \leq 0.6$, $0 \leq d \leq 0.8$, and $0 \leq e \leq 0.8$, provided $a+b+c+d+e=1$.

The meaning of $a+b+c+d+e=1$ is that in a polymer comprising recurring units (a), (b), (c), (d), and (e), the total of proportions of recurring units (a), (b), (c), (d), and (e) is 100 mol % based on the total amount of entire recurring units.

The polymers of the invention should preferably have a weight average molecular weight (Mw) of 1,000 to 500,000, more preferably 2,000 to 30,000, as determined by gel permeation chromatography (GPC) versus polystyrene standards. A polymer with too low a Mw may be miscible with the resist material or dissolvable in water whereas too high a Mw may interfere with film formation after spin coating and lead to a decline of alkali solubility.

The polymers may be synthesized by any desired method, for example, by dissolving unsaturated bond-containing monomers corresponding to the respective units (a), (b), (c), (d) and (e) in an organic solvent, adding a radical initiator thereto, and effecting heat polymerization. Examples of the organic solvent which can be used for polymerization include toluene, benzene, tetrahydrofuran, diethyl ether, dioxane, methanol, ethanol and isopropanol. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the system is heated at 50 to 80° C. for polymerization to take place. The reaction time is about 2 to 100 hours, preferably about 5 to 20 hours. It is acceptable that sulfo groups are in the form of alkali metal salts in the monomeric stage and after polymerization, acid treatment is conducted to resume sulfonic acid residues.

In the practice of the invention, the polymer is dissolved in a suitable solvent to form a solution which is ready for use as the resist protective coating material. For film formation by spin coating technique, the solvent is preferably used in such amounts to provide a polymer concentration of 0.1 to 20% by weight, more preferably 0.5 to 10% by weight.

The solvent used herein is not particularly limited although those solvents in which resist layers can be dissolved should be avoided. It is recommended to avoid the use of conventional resist solvents, for example, ketones such as cyclohexanone and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate.

Suitable solvents in which resist layers are not dissolvable include nonpolar solvents, for example, higher alcohols of at least 4 carbon atoms, toluene, xylene, anisole, hexane, cyclohexane and ethers. Inter alia, higher alcohols of at least 4 carbon atoms are preferred. Examples include, but are not limited to, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, diisopropyl ether, diisobutyl ether, methyl cyclopentyl ether and methyl cyclohexyl ether.

Fluorinated solvents are also preferred because resist layers are not dissolvable therein. Examples include, but are not limited to, 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H, 3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxa-octadecane, perfluorotributylamine, perfluorotrihexylamine, methyl perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluorobutyltetrahydrofuran, perfluorodecalin, perfluoro (1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol, which may be used alone or in admixture.

The lithography pattern forming process of the invention involves the steps of forming a photoresist layer on a wafer, forming a protective coating on the photoresist layer from a resist overlay material, exposing the layer structure to light, and developing. The process is characterized in that the resist overlay material is the water-insoluble, alkali-soluble resist protective coating material defined above.

Specifically, first the water-insoluble, alkali-soluble resist overlay material is applied to a photoresist layer on a wafer by suitable techniques, typically spin coating. The coating thickness is preferably in a range of 10 to 500 nm. The lithography used herein may be either dry lithography wherein a gas such as air or nitrogen is present between the resist protective coating and the projection lens, or immersion lithography wherein a liquid fills in between the resist protective coating and the projection lens. The immersion lithography favors water. In the immersion lithography, whether or not the wafer edge and rear side are cleaned and the cleaning technique are important in preventing flowing of water to the wafer rear side and leaching from the substrate. After spin coating, the resist protective coating is baked at a temperature of 40 to 130° C. for 10 to 300 seconds for evaporating off the solvent. In the case of resist layer formation and dry lithography, edge cleaning is performed during the spin coating. In the case of immersion lithography, contact of water with the substrate surface which is fully hydrophilic is undesirable because water may be left on the substrate surface at the edge. It is then recommended to omit edge cleaning during the spin coating of the resist protective coating.

Once the resist protective coating is formed, light exposure in water is carried out by KrF or ArF immersion lithography. This is followed by post-exposure bake (PEB) and development in an alkaline developer for 10 to 300 seconds. An aqueous solution of 2.38 wt % tetramethylammonium hydroxide, which is commonly used as the alkaline developer, is used herein whereby stripping of the resist protective coating and development of the resist layer are simultaneously effected. Sometimes water is left on the resist protective coating prior to PEB. If PEB is performed in the presence of residual water, water can penetrate through the protective coating to suck up the acid in the resist, impeding pattern formation. To fully remove the water on the protective coating prior to PEB, the water on the protective coating should be dried or recovered by suitable means, for example, spin drying prior to PEB, purging of the protective coating surface with dry air or nitrogen, or optimizing the water recovery nozzle configuration or process on a stage after the exposure. Additionally, the resist protective coating of the invention has high water repellency and thus offers the advantage of efficient water recovery.

The type of photoresist material is not particularly limited. The photoresist may be either positive or negative working and also either a monolayer resist of conventional hydrocarbon or a bilayer resist containing silicon atoms and the like. For KrF lithography resist materials, the preferred base resins are polyhydroxystyrene or polyhydroxystyrene-(meth)acrylate copolymers in which hydrogen atoms of hydroxyl or carboxyl groups are replaced by acid labile groups.

For ArF lithography resist materials, the base resin must have an aromatic-free structure. Illustrative polymers include polyacrylic acid and derivatives thereof, norbornene derivative-maleic anhydride alternating copolymers and ternary or quaternary copolymers thereof with polyacrylic acid or derivatives thereof, tetracyclododecene derivative-maleic anhydride alternating copolymers and ternary or quaternary copolymers thereof with polyacrylic acid or derivatives thereof, norbornene derivative-maleimide alternating copolymers and ternary or quaternary copolymers thereof with polyacrylic acid or derivatives thereof, tetracyclododecene derivative-maleimide alternating copolymers and ternary or quaternary copolymers thereof with polyacrylic acid or derivatives thereof, and polynorbornene and metathesis ring-opening polymers, and a combination of any.

EXAMPLE

Examples of the invention are given below by way of illustration and not by way of limitation. The abbreviations used herein are GPC for gel permeation chromatography, NMR for nuclear magnetic resonance, Mw for weight average molecular weight, Mn for number average molecular weight, and Mw/Mn for molecular weight dispersity. Mw and Mn are determined by GPC versus polystyrene standards.

Monomers 1 to 8 used in Synthesis Examples are identified below by their structural formula.

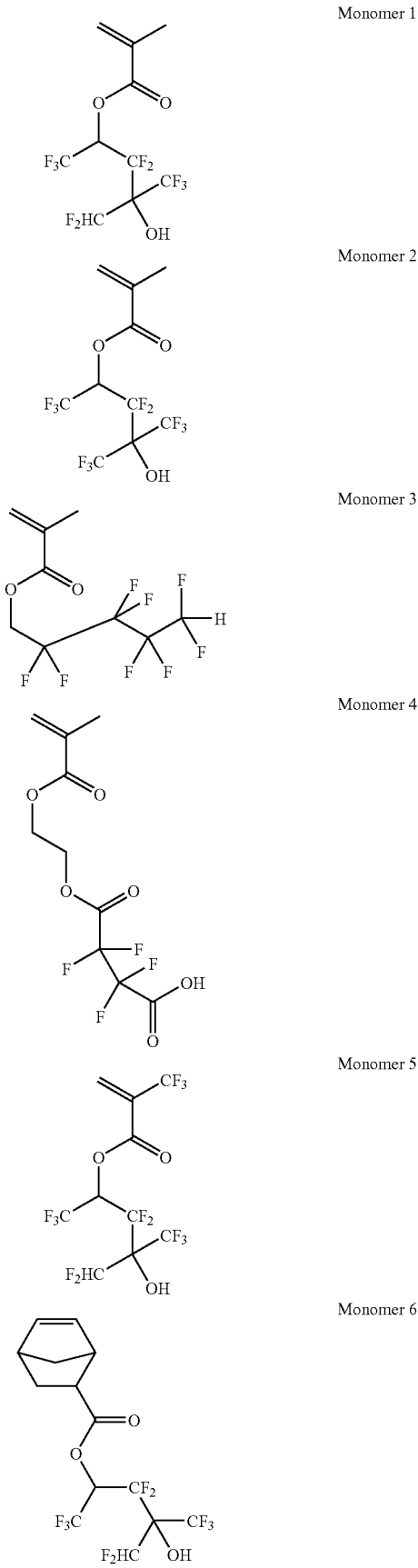

Monomer 7

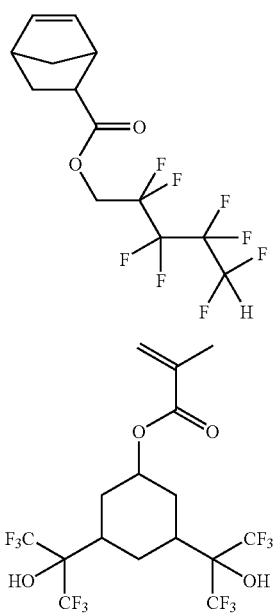

Monomer 8

Synthesis Example 1

A 200-ml flask was charged with 36 g of Monomer 1 and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2′-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 1, was analyzed for composition by ¹H-NMR and for molecular weight by GPC.

Inventive Polymer 1

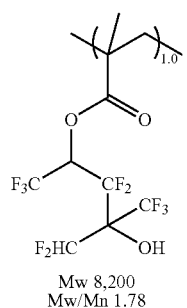

Mw 8,200
Mw/Mn 1.78

Synthesis Example 2

A 200-ml flask was charged with 25.6 g of Monomer 1, 9 g of Monomer 3, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2′-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 2, was analyzed for composition by ¹H-NMR and for molecular weight by GPC.

Inventive Polymer 2

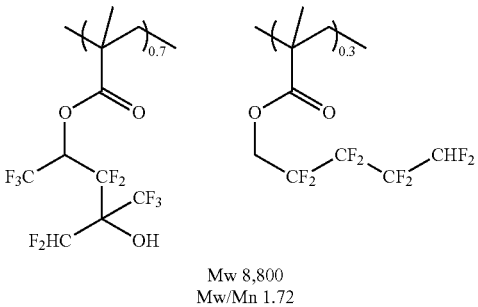

Mw 8,800
Mw/Mn 1.72

Synthesis Example 3

A 200-ml flask was charged with 26.9 g of Monomer 2, 9 g of Monomer 3, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2′-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 3, was analyzed for composition by ¹H-NMR and for molecular weight by GPC.

Inventive Polymer 3

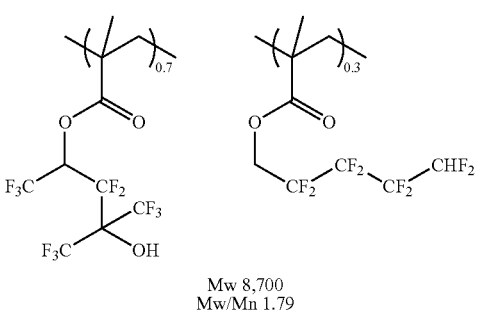

Mw 8,700
Mw/Mn 1.79

Synthesis Example 4

A 200-ml flask was charged with 12.8 g of Monomer 1, 1.3 g of methacrylic acid, 15 g of Monomer 3, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2′-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 4, was analyzed for composition by ¹H-NMR and for molecular weight by GPC.

Inventive Polymer 4

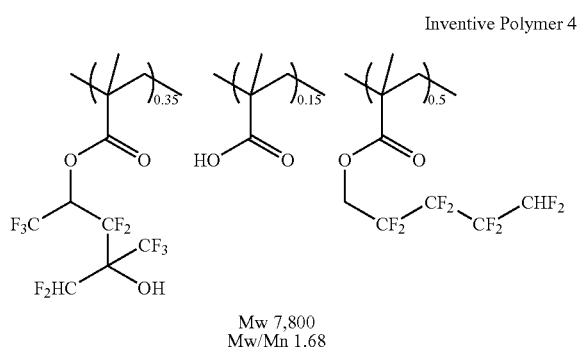

Mw 7,800
Mw/Mn 1.68

Synthesis Example 5

A 200-ml flask was charged with 9.2 g of Monomer 1, 7.5 g of Monomer 4, 15 g of Monomer 3, and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated. The resin, designated Inventive Polymer 5, was analyzed for composition by $^1$H-NMR and for molecular weight by GPC.

Inventive Polymer 5

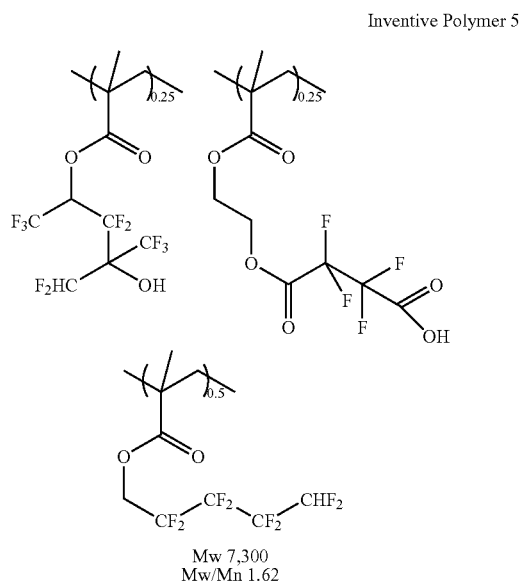

Mw 7,300
Mw/Mn 1.62

Synthesis Example 6

A 200-ml flask was charged with 31.5 g of Monomer 5, 4.2 g of Monomer 6, 7.2 g of Monomer 7, and 20 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 85° C., and held for 25 hours for reaction. The reaction solution was poured into hexane for crystallization whereupon the resin was isolated. The resin, designated Inventive Polymer 6, was analyzed for composition by $^1$H-NMR and for molecular weight by GPC.

Inventive Polymer 6

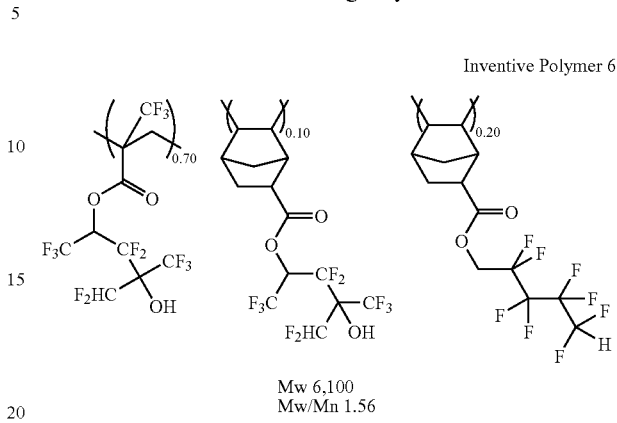

Mw 6,100
Mw/Mn 1.56

Synthesis Example 7

A 200-ml flask was charged with 21.5 g of Monomer 5, 3.0 g of α-trifluoromethylacrylic acid, 10.5 g of Monomer 7, and 20 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 85° C., and held for 25 hours for reaction. The reaction solution was poured into hexane for crystallization whereupon the resin was isolated. The resin, designated Inventive Polymer 7, was analyzed for composition by $^1$H-NMR and for molecular weight by GPC.

Inventive Polymer 7

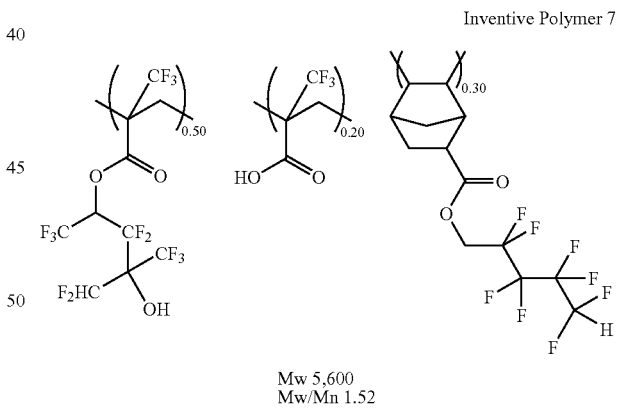

Mw 5,600
Mw/Mn 1.52

Comparative Synthesis Example 1

A 200-ml flask was charged with 35 g of Monomer 8 and 40 g of methanol as a solvent. The reactor was subjected to cooling to −70° C. in a nitrogen atmosphere, evacuation to vacuum, and nitrogen flow, which procedure was repeated three times. The reactor was warmed up to room temperature, charged with 3 g of 2,2'-azobis(2,4-dimethylvaleronitrile) as a polymerization initiator, heated at 65° C., and held for 25 hours for reaction. The reaction solution was poured into hexane for crystallization whereupon the resin was isolated.

The resin, designated Comparative Polymer 1, was analyzed for composition by ¹H-NMR and for molecular weight by GPC.

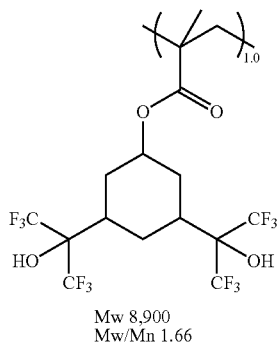

Comparative polymer 1

Mw 8,900
Mw/Mn 1.66

Resist protective coating solutions were prepared by dissolving each 0.5 g of Inventive Polymers 1 to 7 and Comparative Polymer 1 in 25 of isobutylalcohol and filtering through a polypropylene filter having a pore size of 0.2 Wm.

The resist protective coating solutions were spin coated onto silicon substrates and baked at 100° C. for 60 seconds to form protective coatings of 50 nm thick. Using a spectroscopic ellipsometer by J. A. Woollam Co., Inc., the refractive index at wavelength 193 nm of the protective coatings was measured. The results are shown in Table 1.

TABLE 1

| Protective coating polymer | Refractive index at 193 nm |
|---|---|
| Inventive Polymer 1 | 1.54 |
| Inventive Polymer 2 | 1.52 |
| Inventive Polymer 3 | 1.52 |
| Inventive Polymer 4 | 1.54 |
| Inventive Polymer 5 | 1.54 |
| Inventive Polymer 6 | 1.56 |
| Inventive Polymer 7 | 1.57 |
| Comparative Polymer 1 | 1.54 |

The wafers on which the resist protective coatings had been formed by the above procedure were rinsed with deionized water for 5 minutes. A change of coating thickness was examined. The results are shown in Table 2.

TABLE 2

| Protective coating polymer | Coating thickness change before and after rinsing (nm) |
|---|---|
| Inventive Polymer 1 | 0 |
| Inventive Polymer 2 | 0 |
| Inventive Polymer 3 | 0 |
| Inventive Polymer 4 | 0 |
| Inventive Polymer 5 | 0 |
| Inventive Polymer 6 | 0 |
| Inventive Polymer 7 | 0 |
| Comparative Polymer 1 | 0 |

The wafers on which the resist protective coatings had been formed by the above procedure were developed with a 2.38% TMAH aqueous solution. The coatings as developed were measured for thickness. The results are shown in Table 3.

TABLE 3

| Protective coating polymer | Coating thickness after development (nm) |
|---|---|
| Inventive Polymer 1 | 0 |
| Inventive Polymer 2 | 0 |
| Inventive Polymer 3 | 0 |
| Inventive Polymer 4 | 0 |
| Inventive Polymer 5 | 0 |
| Inventive Polymer 6 | 0 |
| Inventive Polymer 7 | 0 |
| Comparative Polymer 1 | 0 |

While the wafers on which the resist protective coatings had been formed by the above procedure were kept horizontal, 50 μL of deionized water was dropped to form a droplet. The wafers were gradually inclined and the angle at which the droplet started sliding down was determined. The results are shown in Table 4.

TABLE 4

| Protective coating polymer | Sliding angle (°) |
|---|---|
| Inventive Polymer 1 | 23 |
| Inventive Polymer 2 | 18 |
| Inventive Polymer 3 | 17 |
| Inventive Polymer 4 | 25 |
| Inventive Polymer 5 | 24 |
| Inventive Polymer 6 | 24 |
| Inventive Polymer 7 | 26 |
| Comparative Polymer 1 | 30 |

A smaller sliding angle indicates an easier flow of water on the coating and hence, a higher scanning speed during scan exposure. The polymers having alkali soluble groups according to the invention have a smaller sliding angle than polymers having hexafluoroalcohol groups.

Next, a resist solution was prepared by dissolving 5 g of a resist polymer, shown below, 0.25 g of a photoacid generator PAG, shown below, and 0.6 g of tri-n-butylamine as a quencher in 55 g of propylene glycol monoethyl ether acetate (PGMEA) and filtering through a polypropylene filter having a pore size of 0.2 μm. An antireflective coating ARC-29A (Nissan Chemical Co., Ltd.) was formed on a silicon substrate to a thickness of 87 nm. The resist solution was applied onto the antireflective coating and baked at 120° C. for 60 seconds, forming a resist film of 150 nm thick. The resist protective coating solution was applied onto the resist film and baked at 100° C. for 60 seconds. In order to simulate immersion lithography, light exposure was followed by rinsing of the coating with deionized water for 5 minutes. The structure was exposed by means of an ArF scanner model S307E (Nikon Corp., NA 0.85, σ 0.93, ⅘ annular illumination, 6% halftone phase shift mask), rinsed for 5 minutes while splashing deionized water, post-exposure baked (PEB) at 110° C. for 60 seconds, and developed with a 2.38% TMAH aqueous solution for 60 seconds.

In the absence of the protective coating, a similar process including light exposure, water rinsing, PEB and development was carried out; and a conventional process excluding water rinsing after exposure was also carried out.

The wafers were sectioned for comparing the profile of 75-nm line-and-space pattern and sensitivity. The results are shown in Table 5.

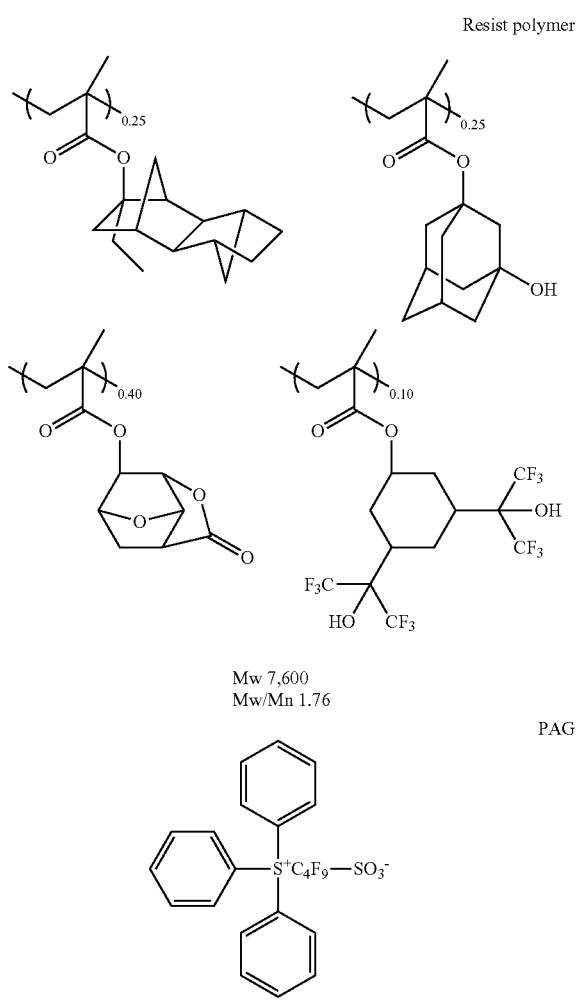

Mw 7,600
Mw/Mn 1.76

PAG

TABLE 5

| Protective coating polymer | Sensitivity, 75 nm pattern profile |
|---|---|
| no protective coating, conventional process excluding rinsing after exposure | 31 mJ/cm$^2$, rectangular |
| Inventive Polymer 1 | 30 mJ/cm$^2$, rectangular |
| Inventive Polymer 2 | 30 mJ/cm$^2$, rectangular |
| Inventive Polymer 3 | 30 mJ/cm$^2$, rectangular |
| Inventive Polymer 4 | 30 mJ/cm$^2$, rectangular |
| Inventive Polymer 5 | 30 mJ/cm$^2$, rectangular |
| Inventive Polymer 6 | 30 mJ/cm$^2$, rectangular |
| Inventive Polymer 7 | 30 mJ/cm$^2$, rectangular |
| no protective coating | 32 mJ/cm$^2$, T-top |
| Comparative Polymer 1 | 29 mJ/cm$^2$, slimming and tapered profile |

When exposure was followed by water rinsing in the absence of the protective coating, the pattern profile became T-top, probably because the acid once generated was dissolved in water. In contrast, when the protective coating was used according to the invention, the pattern profile remained unchanged. In the event the protective coating was formed of a polymer having only hexafluoroalcohol as soluble groups, the resist layer after development was slimmed and had a tapered profile.

Japanese Patent Application No. 2005-174615 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist protective coating material comprising a polymer bearing recurring units provided from a monomer selected from the group consisting of the following compounds

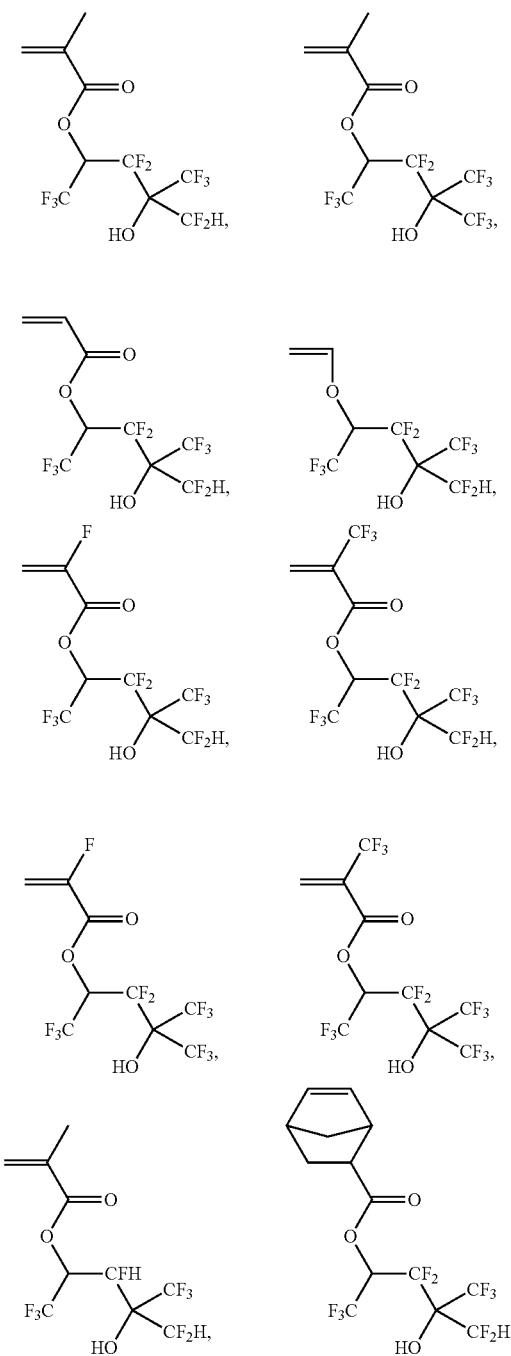

-continued

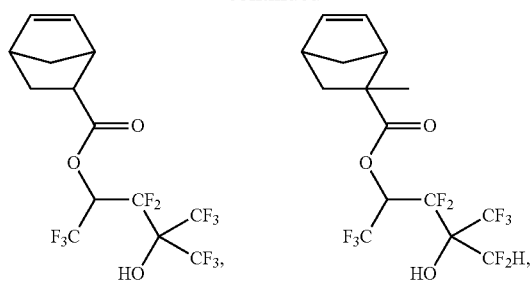

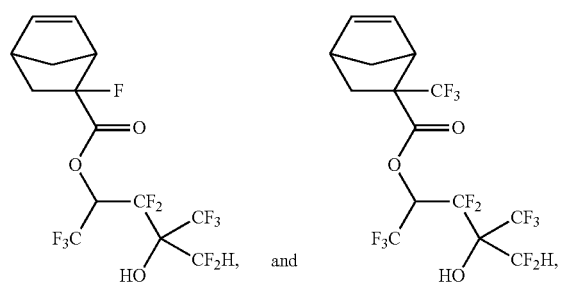

and,
perfluoroalkyl-containing recurring units selected from the group consisting of the following recurring units:

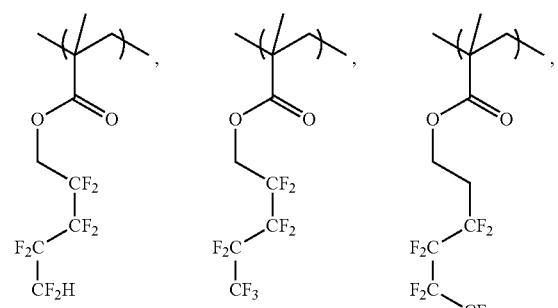

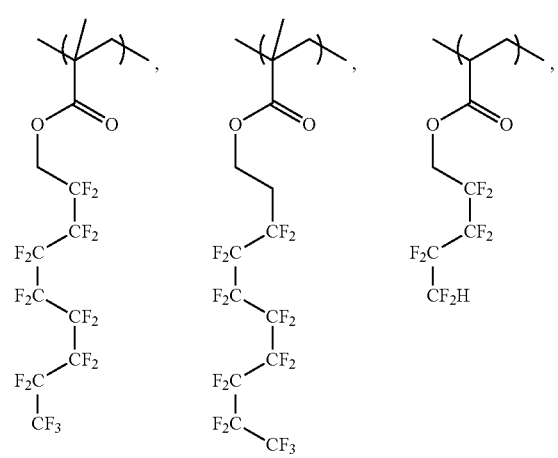

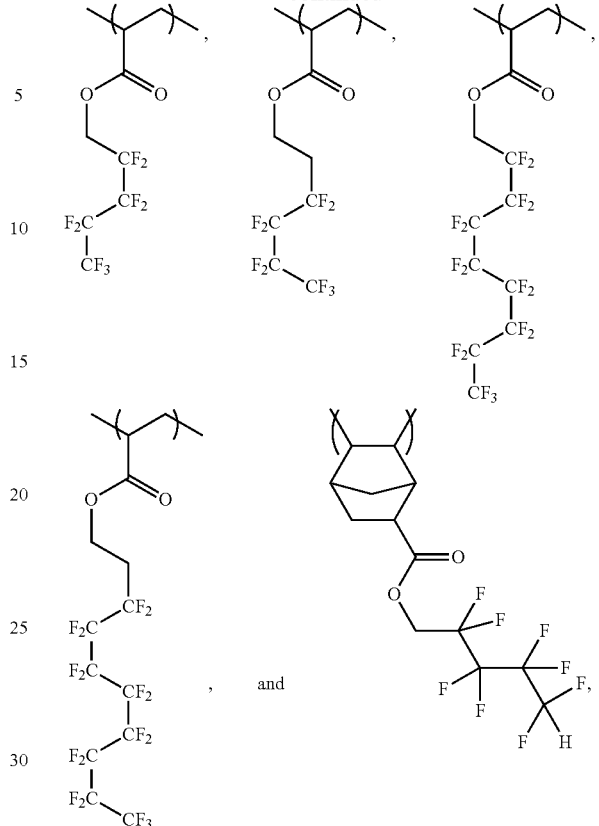

and
a solvent selected from the group consisting of 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, diisopropyl ether, diisobutyl ether, methyl cyclopentyl ether and methyl cyclohexyl ether.

2. The resist protective coating material of claim 1, further comprising a solvent in which said polymer is dissolved.

3. A lithography process for forming a pattern, comprising the steps of forming a photoresist layer on a wafer, forming a protective coating on the photoresist layer from a resist overlay material, exposing the layer structure to light, and developing,
said resist overlay material being the resist protective coating material of claim 1.

4. An immersion lithography process for forming a pattern, comprising the steps of forming a photoresist layer on a wafer, forming a protective coating on the photoresist layer from a resist overlay material, exposing the layer structure in water to light, and developing,
said resist overlay material being the resist protective coating material of claim 1.

5. The process of claim 4 wherein the exposing step includes exposing the layer structure to light having a wavelength in the range of 180 to 250 nm through a projection lens while keeping water between the projection lens and the wafer.

6. The process of claim 4, wherein the developing step is to develop the photoresist layer and strip the protective coating of resist overlay material at the same time, using a liquid alkaline developer.

7. The resist protective coating material of claim 1 wherein the polymer further comprises carboxyl-containing recurring units selected from the group consisting of the following recurring units:

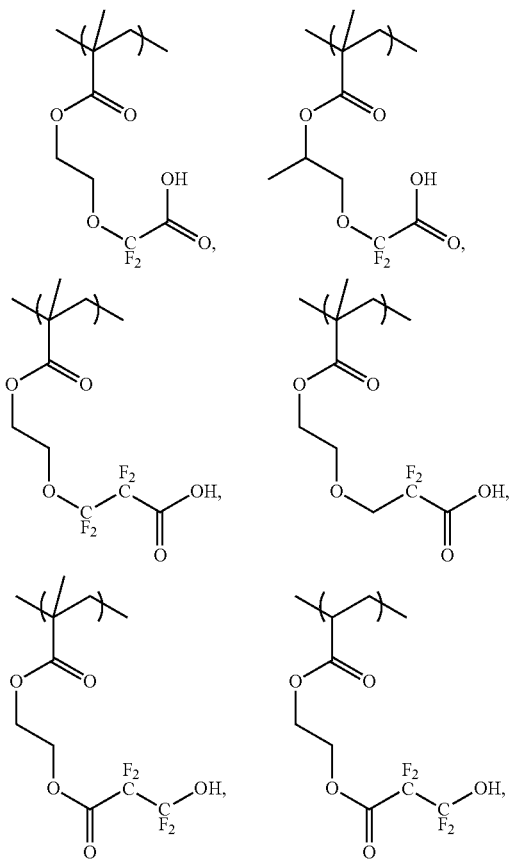

-continued

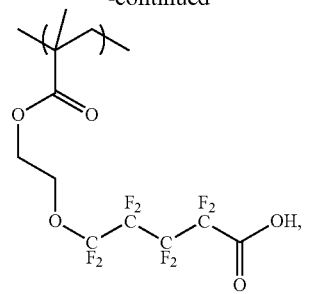

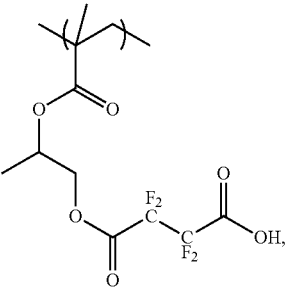

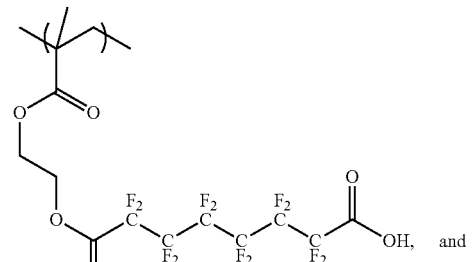 and

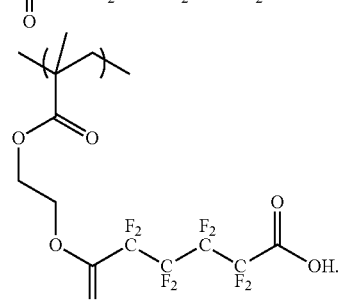

* * * * *